United States Patent
Okuyama et al.

(10) Patent No.: US 10,088,505 B2
(45) Date of Patent: Oct. 2, 2018

(54) CURRENT SENSOR

(71) Applicant: Hitachi Metals, Ltd., Tokyo (JP)

(72) Inventors: Ken Okuyama, Hitachi (JP); Katsuya Akimoto, Mito (JP); Naoki Futakuchi, Hitachinaka (JP); Yujiro Tomita, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 11 days.

(21) Appl. No.: 15/471,914

(22) Filed: Mar. 28, 2017

(65) Prior Publication Data

US 2017/0285076 A1 Oct. 5, 2017

(30) Foreign Application Priority Data

Apr. 1, 2016 (JP) ................................ 2016-074092

(51) Int. Cl.
*G01R 15/20* (2006.01)
*G01R 33/09* (2006.01)

(52) U.S. Cl.
CPC ......... *G01R 15/205* (2013.01); *G01R 33/093* (2013.01)

(58) Field of Classification Search
CPC ................ G01R 33/093; G01R 33/09; H01L 2924/00014
See application file for complete search history.

(56) References Cited

U.S. PATENT DOCUMENTS

| 6,512,359 | B1* | 1/2003 | Tamai | G01R 15/207 324/117 H |
| 9,417,269 | B2 | 8/2016 | Sakai et al. | |
| 2007/0090826 | A1* | 4/2007 | Itoh | G01R 15/207 324/117 R |
| 2011/0270553 | A1* | 11/2011 | Ausserlechner | G01R 15/202 702/64 |
| 2014/0111196 | A1 | 4/2014 | Sakai et al. | |

FOREIGN PATENT DOCUMENTS

JP  2013-011469 A  1/2013

* cited by examiner

*Primary Examiner* — Giovanni Astacio-Oquendo
*Assistant Examiner* — Alvaro Fortich
(74) *Attorney, Agent, or Firm* — McGinn IP Law Group, PLLC.

(57) ABSTRACT

A current sensor includes a busbar carrying an electric current to be measured, a magnetic sensing element for detecting intensity of a magnetic field generated by the current flowing through the busbar, and a pair of shield plates that include magnetic materials and are arranged to sandwich the busbar in a thickness direction of the busbar. The shield plates include a conductive shield plate including a conductive magnetic material and a non-conductive shield plate including a non-conductive magnetic material. The conductive shield plate includes a slit penetrating therethrough. The magnetic sensing element is arranged at a position where the magnetic sensing element overlaps the slits in the thickness direction and does not overlap the conductive shield plate in the thickness direction.

5 Claims, 5 Drawing Sheets

CURRENT SENSOR

The present application is based on Japanese patent application No. 2016-074092 filed on Apr. 1, 2016, the entire contents of which are incorporated herein by reference.

BACKGROUND OF THE INVENTION

1. Field of the Invention

The invention relates to a current sensor.

2. Description of the Related Art

Current sensors are known which are provided with a magnetic sensing element for detecting intensity of a magnetic field generated by an electric current to be measured. JP-A-2013-11469 discloses a current sensor in which a conductor carrying an electric current to be measured and a magnetic sensing element are surrounded by a shield plate (i.e., a magnetic shield portion) to prevent an external magnetic field from affecting the result of detection by the magnetic sensing element.

SUMMARY OF THE INVENTION

The current sensor with the shield plate has a problem that an eddy current may be generated in the shield plate when the frequency of a measured electric current increases so that a detection error occurs due to the effect of the magnetic field generated by the eddy current.

The effect of the eddy current can be reduced by using e.g. a shield plate formed of a non-conductive magnetic material. In general, non-conductive magnetic materials have a lower saturation magnetic flux density than conductive magnetic materials. Thus, if the measured electric current is large and the intensity of a magnetic field generated by the electric current is high, the shield plate formed of the non-conductive magnetic material may reach the magnetic saturation and lose the shielding function for shielding an external magnetic field.

It is an object of the invention to provide a current sensor that can maintain the shielding function even when detecting a large current and also can prevent the detection error due to the eddy current.

According to an embodiment of the invention, a current sensor comprises:

a busbar carrying an electric current to be measured;

a magnetic sensing element for detecting intensity of a magnetic field generated by the current flowing through the busbar; and a pair of shield plates that comprise magnetic materials and are arranged to sandwich the busbar in a thickness direction of the busbar, wherein the shield plates comprise a conductive shield plate comprising a conductive magnetic material and a non-conductive shield plate comprising a non-conductive magnetic material, wherein the conductive shield plate comprises a slit penetrating therethrough, and wherein the magnetic sensing element is arranged at a position where the magnetic sensing element overlaps the slit in the thickness direction and does not overlap the conductive shield plate in the thickness direction.

Effects of the Invention

According to an embodiment of the invention, a current sensor can be provided that can maintain the shielding function even when detecting a large current and also can prevent the detection error due to the eddy current.

BRIEF DESCRIPTION OF THE DRAWINGS

Next, the present invention will be explained in more detail in conjunction with appended drawings, wherein:

FIGS. 1A and 1B are diagrams illustrating a current sensor in an embodiment of the present invention, wherein FIG. 1A is a perspective view and FIG. 1B is a cross sectional view taken along a line A-A in FIG. 1A;

DETAILED DESCRIPTION OF THE PREFERRED EMBODIMENTS

Embodiment

An embodiment of the invention will be described below in conjunction with the appended drawings.

Figure 1A:
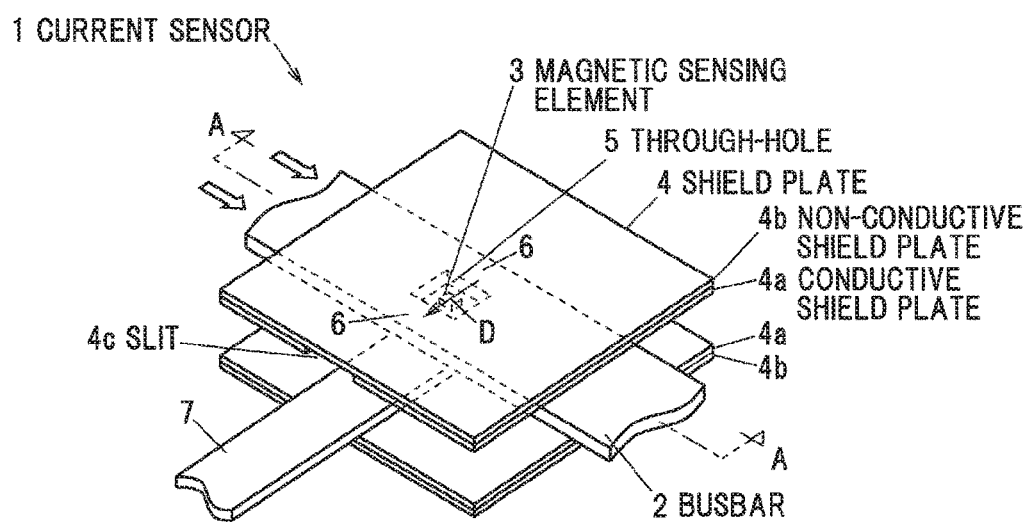
Figure 1B:
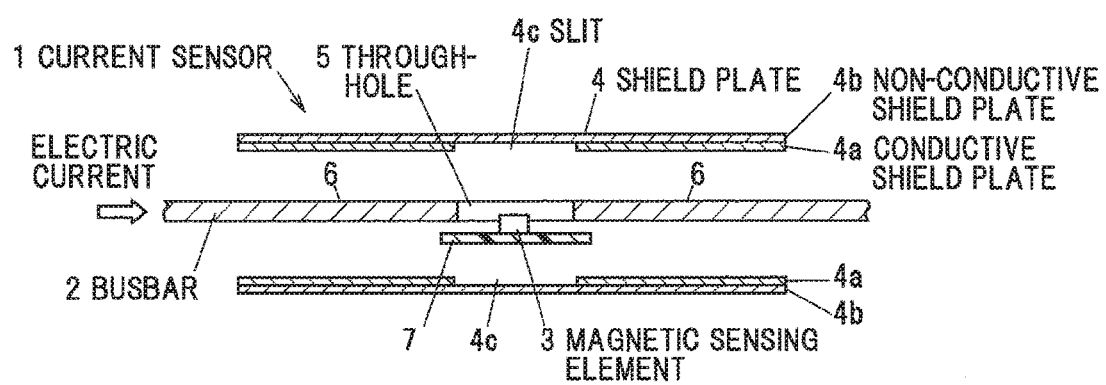

FIGS. 1A and 1B are diagrams illustrating a current sensor in the present embodiment, wherein FIG. 1A is a perspective view and FIG. 1B is a cross sectional view taken along a line A-A in FIG. 1A.

As shown in FIGS. 1A and 1B, a current sensor 1 is provided with a busbar 2 carrying an electric current to be measured, a magnetic sensing element 3 for detecting intensity of a magnetic field generated by the current flowing through the busbar 2, and a pair of shield plates 4 which are formed of magnetic materials and are arranged to sandwich the busbar 2 in a thickness direction of the busbar 2.

The busbar 2 is a plate-shaped conductor formed of a highly electrically conductive material such as copper or aluminum and serves as a current path for carrying a current. The busbar 2 is used as a power line between, e.g., a motor and an inverter in an electric car or hybrid car. The current flowing through the busbar 2 is, e.g., about 200 A in a steady state and up to about 800 A as inrush current in an abnormal state, etc., and has a frequency of, e.g., up to about 100 kHz. In the present embodiment, the current flows along a longitudinal direction of the busbar 2.

The magnetic sensing element 3 is configured to output a voltage output signal according to magnetic field intensity (magnetic flux density) in a direction along a detection axis D. In the present embodiment, a GMR (Giant MagnetoResistive effect) sensor having a high sensitivity is used as the magnetic element 3.

The shield plates 4 are provided to shield an external magnetic field to prevent the external magnetic field from affecting the detection result of the magnetic sensing element 3. The shield plates 4 are arranged at a distance from the busbar 2 so as to sandwich the busbar 2 in a thickness direction. In addition, the shield plates 4 are arranged such that the surfaces thereof are parallel to the surface of the busbar 2 (such that a normal direction of the shield plates 4 coincides with the thickness direction of the busbar 2). The details of the shield plate 4 will be described later.

In the present embodiment, a through-hole 5 is formed on the busbar 2. The through-hole 5 penetrates the busbar 2 and the busbar 2 is present around the circumference of the through-hole 5. In other words, the through-hole 5 does not have a notched shape with an opening on a side of the busbar 2. As a result of forming such through-hole 5, current paths 6 are formed on both sides of the through-hole 5.

In the present embodiment, the through-hole 5 is formed in the middle of the busbar 2 in a width direction. The current paths 6 formed on the both sides of the through-hole 5 have the same width. Although the through-hole 5 in the present embodiment is formed on the busbar 2 at the center in the width direction, the through-hole 5 may be formed on the busbar 2 at a position offset from the center in the width direction. In other words, the current paths 6 on the both sides of the through-hole 5 may have different widths.

Inside the through-hole 5, magnetic fields generated by the two current paths 6 cancel each other out. That is, as a result of forming the through-hole 5, magnetic field intensity is reduced inside the through-hole 5 or in the vicinity of the through-hole 5.

In the present embodiment, the magnetic sensing element 3 is arranged at a position overlapping the through-hole 5 in the thickness direction of the busbar 2. In other words, the magnetic sensing element 3 is arranged at a position overlapping the through-hole 5 when viewed in plan from one side of the thickness direction of the busbar 2. Here, the term "the magnetic sensing element 3 is arranged at a position overlapping the through-hole 5 in the thickness direction of the busbar 2" means that at least a portion of the magnetic sensing element 3 is located at a position overlapping the through-hole 5 when viewed in plan from above (or below) in FIG. 1B, and it includes, e.g., the case where only a portion of the magnetic sensing element 3 is located at a position overlapping the through-hole 5 when viewed in plan. Meanwhile, the magnetic sensing element 3 when viewed in the cross section of FIG. 1B may be located partially inside the through-hole 5 or entirely outside the through-hole 5 (above or below the through-hole 5). In the present embodiment, the magnetic sensing element 3 is arranged between the two shield plates 4 at a distance from the two shield plates 4.

By forming the through-hole 5 on the busbar 2 and arranging the magnetic sensing element 3 at a position overlapping the through-hole 5 in the thickness direction of the busbar 2, it is possible to reduce a magnetic field to be detected by the magnetic sensing element 3 even when a large current is flowing through the busbar 2. As a result, a GMR sensor, etc., only capable of detecting a narrow range of magnetic field intensity can be used as the magnetic sensing element 3 even when the electric current flowing through the busbar 2 is a large current, and the current thus can be detected with high accuracy.

The magnetic sensing element 3 is mounted on a substrate 7. The substrate 7 is inserted between the busbar 2 and the shield plate 4 such that the magnetic sensing element 3 is located at a position overlapping the through-hole 5 when viewed in plan. The substrate 7 is formed of a resin such as glass epoxy.

The GMR sensor used as the magnetic sensing element 3 has the detection axis D along the surface of the substrate 7. In the present embodiment, the magnetic sensing element 3 is arranged such that the detection axis D thereof extends along the width direction of the busbar 2. The magnetic sensing element 3 may alternatively be arranged such that the detection axis D extends along the thickness direction of the busbar 2. In this case, however, it is necessary to bend a front end portion of the substrate 7 at 90° and then to mount the magnetic sensing element 3 on the bent portion, which makes the structure of the current sensor 1 complicated.

A molding resin is filled between the two shield plates 4 such that the two shield plates 4, the magnetic sensing element 3, the busbar 2 and the substrate 7 are integrated, even though it is not illustrated. The molding resin prevents detection errors due to vibration, etc., by stabilizing the positions of the magnetic sensing element 3, the busbar 2 and the two shield plates 4, and also prevents detection errors due to penetration of foreign object between the shield plates 4.

In the current sensor 1 of the present embodiment, each of the shield plates 4 is composed of a conductive shield plate 4a formed of a conductive magnetic material and a non-conductive shield plate 4b formed of a non-conductive magnetic material. The conductive magnetic material used to form the conductive shield plate 4a is, e.g., silicon steel or permalloy. The non-conductive magnetic material used to form the non-conductive shield plate 4b is, e.g., ferrite.

In the current sensor 1 of the present embodiment, each conductive shield plate 4a has a slit 4c penetrating therethrough and the magnetic sensing element 3 is arranged at a position where the magnetic sensing element 3 overlaps the slits 4c in the thickness direction and does not overlap the conductive shield plates 4a in the thickness direction.

In other words, in the present embodiment, the shield plates 4 have a laminated structure formed by laminating the conductive shield plate 4a and the non-conductive shield plate 4b and the slits 4c are formed on the conductive shield plates 4a at positions overlapping the magnetic sensing element 3 in the thickness direction (positions above and below the magnetic sensing element 3). In the present embodiment, the shield plate 4 has only the non-conductive shield plate 4b at a position overlapping the magnetic sensing element 3 in the thickness direction (the position above or below the magnetic sensing element 3).

Since the non-conductive shield plate 4b is electrically non-conductive, eddy currents are not generated even when the electric current flowing through the busbar 2 has a high frequency. However, due to a low saturation magnetic flux density, the non-conductive shield plate 4b may reach magnetic saturation and lose the shielding function when the electric current flowing through the busbar 2 is large.

For this reason, in the present embodiment, the conductive shield plate 4a with a high saturation magnetic flux density is deposited on the non-conductive shield plate 4b such that the shielding function is maintained even when the electric current flowing through the busbar 2 is a large current.

In this regard, however, the conductive shield plate 4a is electrically conductive. Therefore, eddy currents are generated in the conductive shield plate 4a when the electric current flowing through the busbar 2 has a high frequency. For this reason, in the present embodiment, the slits 4c are formed on the conductive shield plates 4a above and below the magnetic sensing element 3 such that the conductive shield plates 4a are located at a distance from the magnetic sensing element 3, thereby reducing the effect of eddy currents generated in the conductive shield plates 4a.

Figure 2:
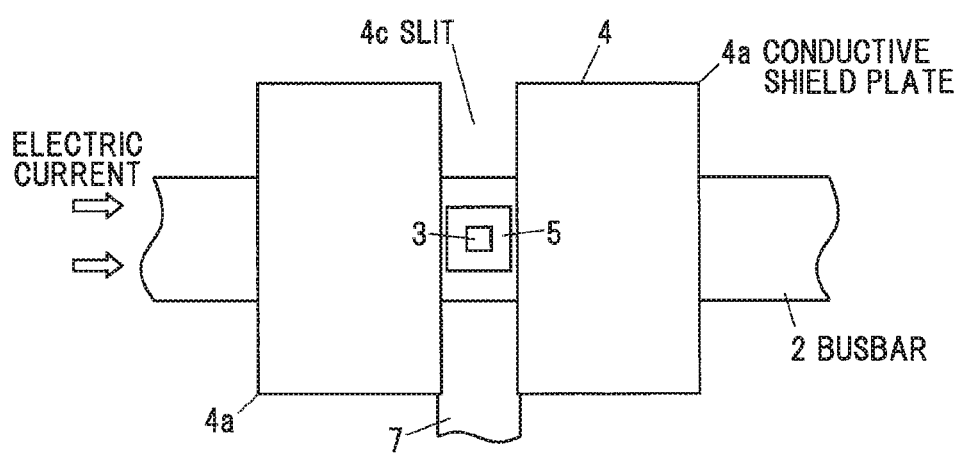
FIG. 2 is an explanatory diagram illustrating the positions of a slit, a through-hole and a magnetic sensing element in the current sensor shown in FIGS. 1A and 1B.

As shown in FIGS. 1A to 2, in the present embodiment, a belt-shaped slit 4c is formed on the conductive shield plate 4a such that the conductive shield plate 4a is split into halves in a length direction of the busbar 2 (in a horizontal direction in FIG. 2).

Figure 3:
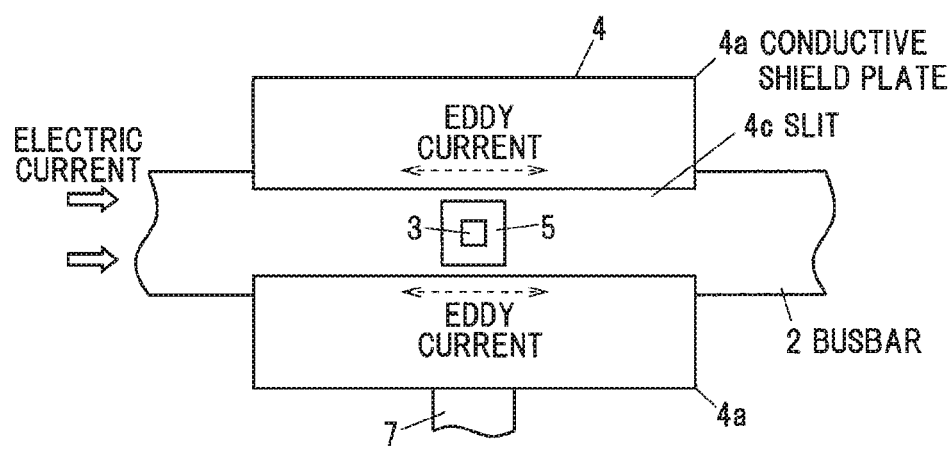
FIG. 3 is an explanatory diagram illustrating the positions of a slit, a through-hole and a magnetic sensing element in a current sensor in a modification of the invention.

The slit 4c is not limited thereto and may be formed to split the conductive shield plate 4a into halves in a width direction of the busbar 2 (in a vertical direction in FIG. 3) as shown in FIG. 3. In this case, however, since the direction of the eddy currents generated in the conductive shield plate 4a is along the length direction of the busbar 2 as indicated by the dashed arrows in FIG. 3, it is necessary to increase a distance between the conductive shield plates 4a and the magnetic sensing element 3 by increasing the width of each slit 4c (the width in the vertical direction in the drawing) such that the effect of eddy current is reduced. This results in an increase in the area in which the shielding function is maintained only by the non-conductive shield plate 4b.

In contrast, when the slit 4c is formed such that the conductive shield plate 4a is split into halves in the length direction as shown in FIG. 2, the eddy currents are interrupted by the slit 4c. Therefore, even when the conductive shield plate 4a is arranged closer to the magnetic sensing element 3 by reducing the width of the slit 4c (the width in the horizontal direction in FIG. 2), it is possible to reduce the effect of eddy current. As a result, it is possible to reduce the area in which the shielding function is maintained only by the non-conductive shield plate 4b.

When the area in which the shielding function is maintained only by the non-conductive shield plate 4b is large, the non-conductive shield plate 4b may reach magnetic saturation and may not be able to maintain the shielding function, depending on the magnitude of the electric current flowing through the busbar 2. Therefore, in view of maintaining the shielding function, it is desirable to configure as shown in FIG. 2, such that the effect of eddy current can be reduced even when the width of the slit 4c is reduced, i.e., it is desirable to form the slit 4c such that the conductive shield plate 4a is split into halves in the length direction.

As described above, it is desirable that the conductive shield plates 4a be located as far from the magnetic sensing element 3 as possible by increasing the width of the slit 4c as much as possible in view of reducing the effect of eddy current. However, when the width of the slit 4c is too large, the non-conductive shield plate 4b is likely to reach magnetic saturation and may not be able to maintain the shielding function since the area in which the shielding function is maintained only by the non-conductive shield plate 4b is large.

Therefore, by taking into consideration the magnitude of the electric current flowing through the busbar 2, the slit 4c is desirably formed to have an appropriate width with which the effect of eddy current can be sufficiently reduced and also the shielding function can be maintained by preventing magnetic saturation of the non-conductive shield plate 4b. In FIGS. 2 and 3, illustration of the non-conductive shield plate 4b is omitted for easy understanding of the position of the slit 4c.

Desirably, each slit 4c covers the entire through-hole 5 when viewed in plan (i.e., the conductive shield plate 4a does not overlap the through-hole 5 when viewed in plan) such that a sufficient distance is provided between the conductive shield plate 4a and the magnetic sensing element 3. In other words, the through-hole 5 is desirably formed at a position where the through-hole 5 overlaps the slits 4c in the thickness direction and does not overlap the conductive shield plates 4a in the thickness direction.

Furthermore, since the effect of eddy current increases as the magnetic sensing element 3 is closer to the conductive shield plate 4a, the magnetic sensing element 3 is desirably arranged at a position where the center thereof (the center in the width and length directions) and the center of the slit 4c in the width direction (the horizontal direction in FIG. 2, the vertical direction in FIG. 3) overlap in the thickness direction (i.e., the magnetic sensing element 3 is arranged at the center of the slit 4c in the width direction when viewed in plan).

Although the slits 4c having the same width are respectively formed on the both conductive shield plates 4a arranged above and below the busbar 2 in the present embodiment, the slits 4c formed on the two conductive shield plates 4a may have different widths.

In addition, since the non-conductive shield plate 4b has a lower saturation magnetic flux density than the conductive shield plate 4a as described above, the distance to the busbar 2 is desirably farther from the non-conductive shield plate 4b than from the conductive shield plate 4a. In the present embodiment, the shield plate 4 is configured that the conductive shield plate 4a is arranged on the busbar 2 side and the non-conductive shield plate 4b is arranged on the side opposite to the busbar 2. As a result, the shielding function is maintained more easily.

In addition, the conductive shield plate 4a is desirably magnetically adhered to the non-conductive shield plate 4b. This is because when the conductive shield plate 4a is magnetically adhered to the non-conductive shield plate 4b, the two shield plates 4a and 4b, as a whole, function as one magnetic body and the shielding function can be further improved. However, the conductive shield plate 4a and the non-conductive shield plate 4b do not need to be directly in contact with each other and, for example, a gap of about several μm may be present between the two shield plates 4a and 4b. Alternatively, the two shield plates 4a and 4b may be laminated via a resin coating provided on, e.g., the surface of the conductive shield plate 4a.

Figure 4:
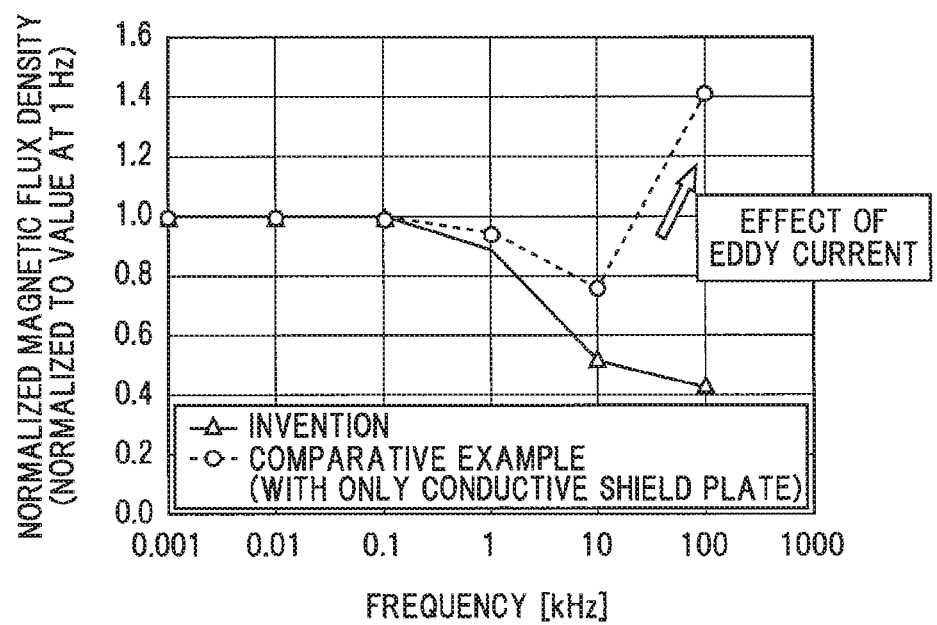
FIG. 4 is a graph showing a relation between frequency of electric current to be detected and detected magnetic flux density.

FIG. 4 shows a relation between frequency of the electric current flowing through the busbar 2 (an electric current to be detected) and magnetic flux density detected by the magnetic sensing element 3. In FIG. 4, the vertical axis indicates the value of magnetic flux density normalized to magnetic flux density at a frequency of 1 Hz (0.001 kHz). The current value is the same for each frequency.

As shown in FIG. 4, although the current value is constant, the magnetic flux density detected by the magnetic sensing element 3 varies depending on the frequency and has frequency dependence. The causes of the frequency dependence include the effect of eddy current mentioned above and also, e.g., variation in current distribution due to the skin effect.

As indicated by a solid line in FIG. 4, since the effect of eddy current is reduced, the current sensor 1 in the present embodiment shows simple frequency characteristics that the detected magnetic flux density simply decreases with an increase in frequency. In case of such simple frequency characteristics, correction can be easily made afterward.

On the other hand, as indicated by a dashed line in FIG. 4, Comparative Example using the shield plate 4 consisting of only the conductive shield plate 4a shows complicated frequency characteristics that the detected magnetic flux density once decreases at a frequency of about 10 kHz and then increases at higher frequency due to the effect of eddy current. In case of such complicated frequency characteristics, appropriate correction cannot be easily made afterward.

As described above, in the current sensor 1 in the present embodiment, frequency characteristics with simple magnetic flux density decrease can be realized by reducing the effect of eddy current and the magnetic flux density detected by the magnetic sensing element 3 can be easily corrected according to the frequency of the current.

Although the current flowing through one busbar 2 is detected in the present embodiment, the invention is applicable to detect currents flowing through plural busbars 2.

Figure 5:
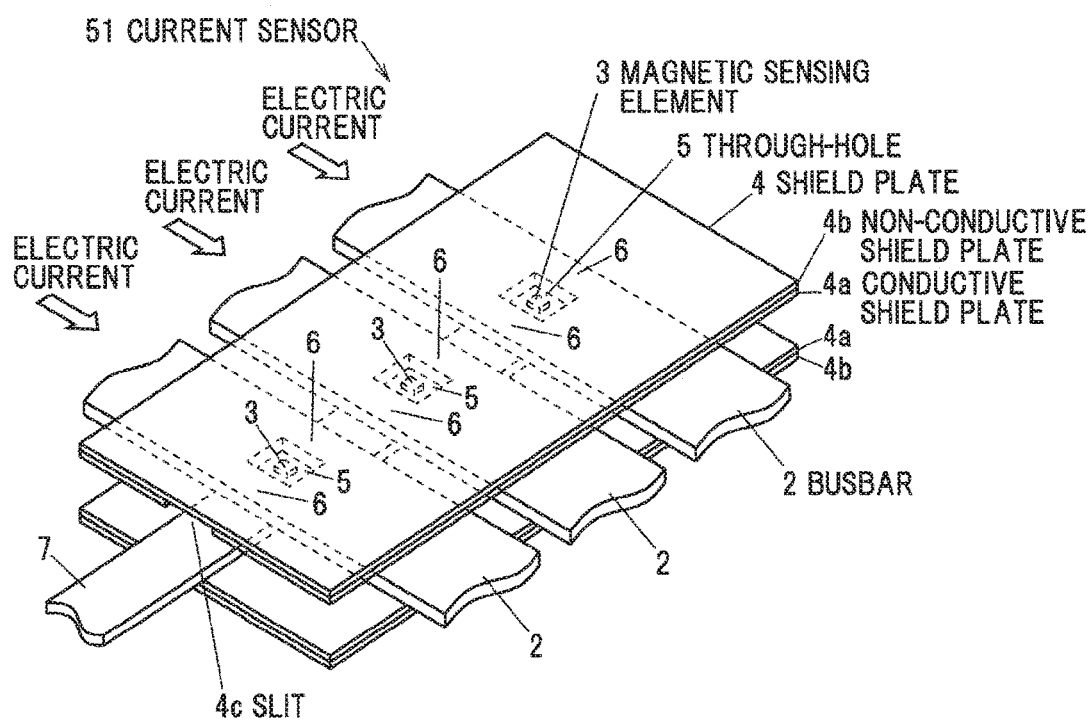
FIG. 5 is a perspective view showing a current sensor in a modification of the invention.

For example, in case of detecting currents flowing through three busbars 2 as in a current sensor 51 shown in FIG. 5, the busbars 2 are aligned in the same plane and are all sandwiched between the two shield plates 4 (the conductive shield plates 4a and the non-conductive shield plates 4b). In this case, the magnetic sensing elements 3 corresponding to the respective busbars 2 are arranged at positions overlapping the through-holes 5 of the busbars 2 when viewed in plan. By aligning the through-holes 5 of the busbars 2 in the width direction, plural (three in this example) magnetic sensing elements 3 corresponding to the respective busbars 2 can be mounted on one substrate 7 and it is thus possible to detect currents flowing through plural busbars 2 by a simple structure. In addition, in this case, the slits 4c are formed to extend above and below the respective magnetic sensing elements 3 and through-holes 5 such that the conductive shield plates 4a are split into halves in then length direction. The currents flowing through the busbars 2 may be, e.g., three-phase AC flowing between an inverter and a motor.

Functions and Effects of the Embodiment

As described above, the current sensor 1 in the present embodiment is configured that each shield plate 4 is composed of the conductive shield plate 4a formed of a conductive magnetic material and the non-conductive shield plate 4b formed of a non-conductive magnetic material, each conductive shield plate 4a has the slit 4c penetrating therethrough, and the magnetic sensing element 3 is arranged at a position where the magnetic sensing element 3 overlaps the slits 4c in the thickness direction and does not overlap the conductive shield plates 4a in the thickness direction.

In such a configuration, it is possible to maintain the shielding function against magnetostatic disturbance by avoiding magnetic saturation of the shield plate 4 even when detecting a large current, thereby preventing detection errors due to the effect of eddy current. In addition, by reducing the effect of eddy current, it is possible to reduce frequency dependence of magnetic flux density detected by the magnetic sensing element 3 (reduce a rapid increase in magnetic flux density due to eddy currents), and the magnetic flux density detected by the magnetic sensing element 3 can be easily corrected according to the frequency of the electric current.

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A current sensor (1), comprising: a busbar (2) carrying an electric current to be measured, a magnetic sensing element (3) for detecting intensity of a magnetic field generated by the current flowing through the busbar (2); and a pair of shield plates (4) that comprise magnetic materials and are arranged to sandwich the busbar (2) in a thickness direction of the busbar (2), wherein the shield plates (4) comprise a conductive shield plate (4a) comprising a conductive magnetic material and a non-conductive shield plate (4b) comprising a non-conductive magnetic material, the conductive shield plate (4a) comprise a slit (4c) penetrating therethrough, and the magnetic sensing element (3) is arranged at a position where the magnetic sensing element (3) overlaps the slit (4c) in the thickness direction and does not overlap the conductive shield plate (4a) in the thickness direction.

[2] The current sensor (1) defined by [1], wherein the slit (4c) is formed such that the conductive shield plate (4a) is split into halves in a longitudinal direction of the busbar (2).

[3] The current sensor (1) defined by [1] or [2], wherein the non-conductive shield plate (4b) is arranged farther from the busbar (2) than the conductive shield plate (4a).

[4] The current sensor (1) defined by any one of [1] to [3], wherein the conductive shield plate (4a) is magnetically adhered to the non-conductive shield plate (4b).

[5] The current sensor (1) defined by any one of [1] to [4], wherein the busbar (2) comprises a through-hole (5) penetrating therethrough and current paths (6) formed on both sides of the through-hole (5), the through-hole (5) is formed at a position where the through-hole (5) overlaps the slit (4c) in the thickness direction and does not overlap the conductive shield plates (4a) in the thickness direction, and the magnetic sensing element (3) is arranged at a position overlapping the through-hole (5) in the thickness direction.

Although the embodiment of the invention has been described, the invention according to claims is not to be limited to the embodiment described above. Further, please note that all combinations of the features described in the embodiment are not necessary to solve the problem of the invention.

The invention can be appropriately modified and implemented without departing from the gist thereof.

For example, the through-hole 5 is formed on the busbar 2 in the embodiment, it is not limited thereto and the through-hole 5 may be omitted. When the through-hole 5 is omitted, the magnetic sensing element 3 is arranged between the busbar 2 and one of the shield plates 4 so as to face one surface of the busbar 2. In this case, since it is less likely to be affected by eddy currents generated in the other shield plate 4 which is arranged on the opposite side to the magnetic sensing element 3, the slit 4c on the conductive shield plate 4a of the other shield plate 4 may be omitted or the other shield plate 4 may be formed of only the conductive shield plate 4a.

In addition, although the conductive shield plate 4a in the embodiment is split into halves in the length direction of the busbar 2, the conductive shield plate 4a may have a portion(s) connected in the longitudinal direction at a position(s) sufficiently far from the magnetic sensing element 3 to the extent that the magnetic sensing element 3 is not affected by eddy currents.

Furthermore, although a GMR sensor is used as the magnetic sensing element 3 in the embodiment, it is not limited thereto. Another element such as AMR (Anisotropic MagnetoResistive) sensor, TMR (Tunneling MagnetoResistive) sensor or Hall IC can be used as the magnetic sensing element 3. In this regard, to realize high accuracy current detection, it is desirable to use the magnetic sensing element 3 with as high accuracy as possible.

In addition, although one magnetic sensing element 3 is used in the embodiment, it is not limited thereto. Plural (e.g., two) magnetic sensing elements 3 may be arranged at positions overlapping the through-hole 5 when viewed in plan, such that an electric current is detected based on outputs from the plural magnetic sensing elements 3.

What is claimed is:

1. A current sensor, comprising:
a busbar carrying an electric current to be measured;
a magnetic sensing element for detecting intensity of a magnetic field generate by a current flowing through the busbar; and
a pair of shield plates that comprise magnetic materials and are arranged to sandwich the busbar in a thickness direction of the busbar,
wherein the pair of shield plates comprise a conductive shield plate comprising a conductive magnetic material and a non-conductive shield plate comprising a non-conductive magnetic material,
wherein the conductive shield plate comprises a slit penetrating therethrough, and
wherein the magnetic sensing element is arranged at a position where the magnetic sensing element overlaps the slit in the thickness direction of the busbar and does not overlap the conductive shield plate in the thickness direction of the busbar.

2. The current sensor according to claim 1, wherein the slit is formed such that the conductive shield plate is split into halves in a longitudinal direction of the busbar.

3. The current sensor according to claim 1, wherein the non-conductive shield plate is arranged farther from the busbar than the conductive shield plate.

4. The current sensor according to claim 1, wherein the conductive shield plate is magnetically adhered to the non-conductive shield plate.

5. The current sensor according to claim 1, wherein the busbar comprises a through-hole penetrating therethrough and current paths formed on both sides of the through-hole, the through-hole is formed at a position where the through-hole overlaps the slit in the thickness direction of the busbar and does not overlap the conductive shield plates in the thickness direction of the busbar, and the magnetic sensing element is arranged at a position overlapping the through-hole in the thickness direction of the busbar.

\* \* \* \* \*